United States Patent
Monson et al.

(10) Patent No.: US 8,215,377 B1
(45) Date of Patent: Jul. 10, 2012

(54) HEAT TRANSFER DEVICE WITH FLEXIBLE COOLING LAYER

(75) Inventors: Robert J. Monson, St. Paul, MN (US); Kevin J. Thorson, Eagan, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 492 days.

(21) Appl. No.: 12/436,454

(22) Filed: May 6, 2009

(51) Int. Cl.
F28F 7/00 (2006.01)

(52) U.S. Cl. ............... 165/46; 165/104.21; 165/104.26; 165/104.33

(58) Field of Classification Search ............ 165/104.33, 165/104.26, 104.21, 46, 170
See application file for complete search history.

(56) References Cited

U.S. PATENT DOCUMENTS

| | | | | |
|---|---|---|---|---|
| 3,957,107 A * | 5/1976 | Altoz et al. | ............ | 165/276 |
| 4,212,347 A * | 7/1980 | Eastman | ............ | 165/46 |
| 5,411,077 A * | 5/1995 | Tousignant | ............ | 165/104.33 |
| 6,062,299 A * | 5/2000 | Choo et al. | ............ | 165/46 |
| 6,230,788 B1 * | 5/2001 | Choo et al. | ............ | 165/46 |
| 6,622,782 B2 * | 9/2003 | Malhammar | ............ | 165/46 |
| 7,007,741 B2 * | 3/2006 | Sen et al. | ............ | 165/46 |
| 7,907,409 B2 * | 3/2011 | Wyatt et al. | ............ | 361/700 |
| 7,952,873 B2 * | 5/2011 | Glahn et al. | ............ | 361/699 |
| 2002/0088605 A1 * | 7/2002 | Malhammar | ............ | 165/46 |
| 2004/0074630 A1 * | 4/2004 | Sen et al. | ............ | 165/46 |
| 2008/0283222 A1 * | 11/2008 | Chang et al. | ............ | 165/104.26 |
| 2009/0259788 A1 * | 10/2009 | Lee et al. | ............ | 710/302 |

OTHER PUBLICATIONS

U.S. Appl. No. 11/195,943, filed Aug. 3, 2005.

* cited by examiner

*Primary Examiner* — Henry Yuen
*Assistant Examiner* — Devon Russell
(74) *Attorney, Agent, or Firm* — Hamre, Schumann, Mueller & Larson, P.C.

(57) ABSTRACT

A heat transfer device generally includes a flexible cooling layer for use in heat pipe technology for example. The flexible layer has outer and inner surfaces. A backing layer has an outer surface and an inner surface facing the inner surface of the flexible layer. A rigid separator portion is disposed between the inner surfaces of the flexible and backing layers, and has inner and outer surfaces. The inner surfaces of the flexible and backing layers and the rigid separator portion define a sealed chamber. An evaporable working liquid is contained within the sealed chamber. The working liquid expands when heated to expand a volume within the sealed chamber, such that the flexible layer extends away from the sealed chamber. The flexible layer, when extended transfers heat through the sealed chamber to a cooler area of the device.

19 Claims, 4 Drawing Sheets

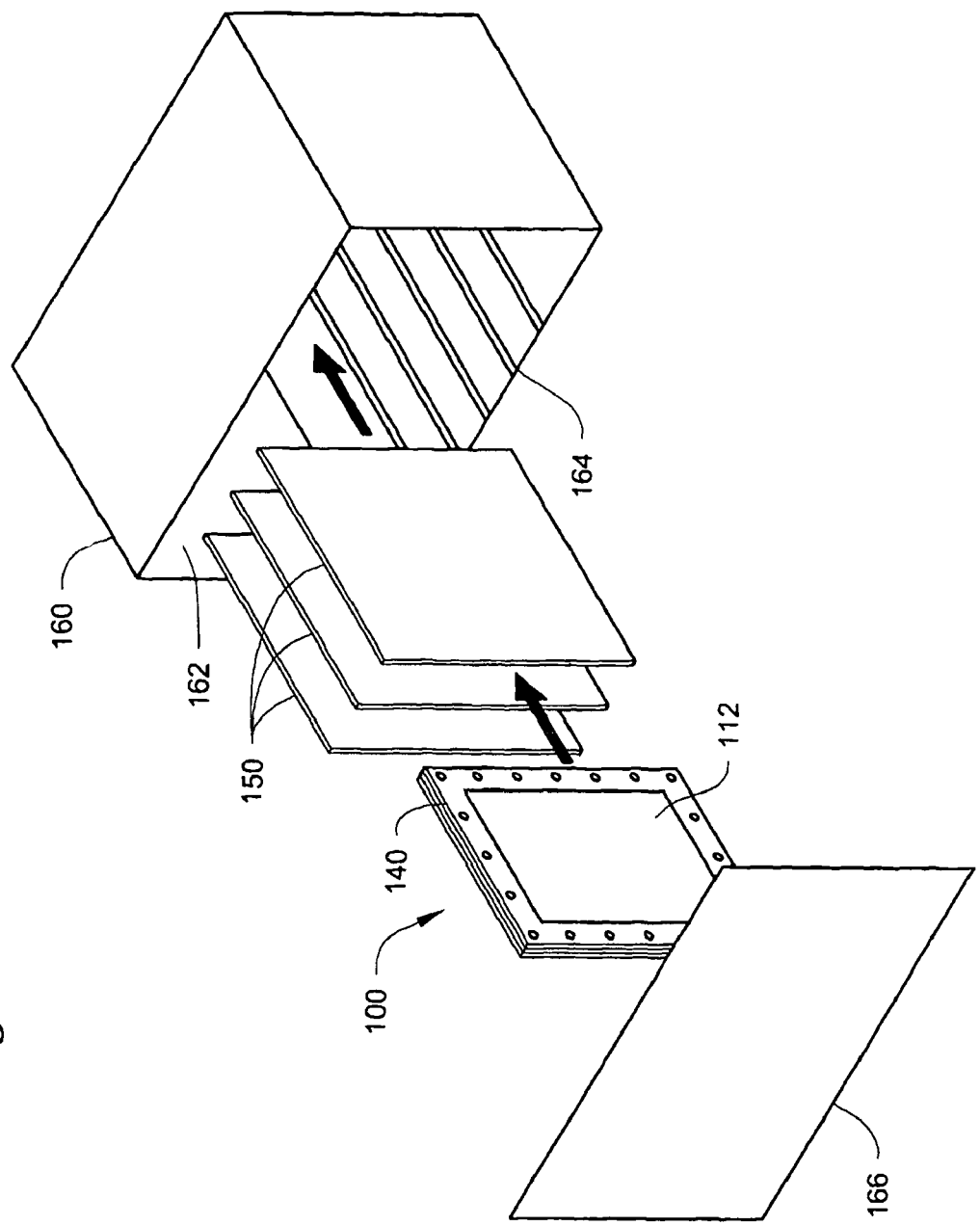
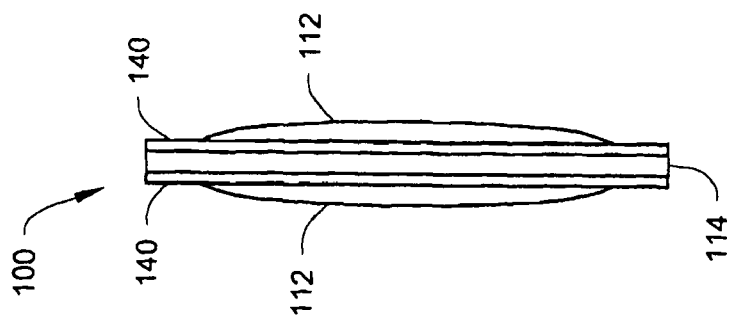

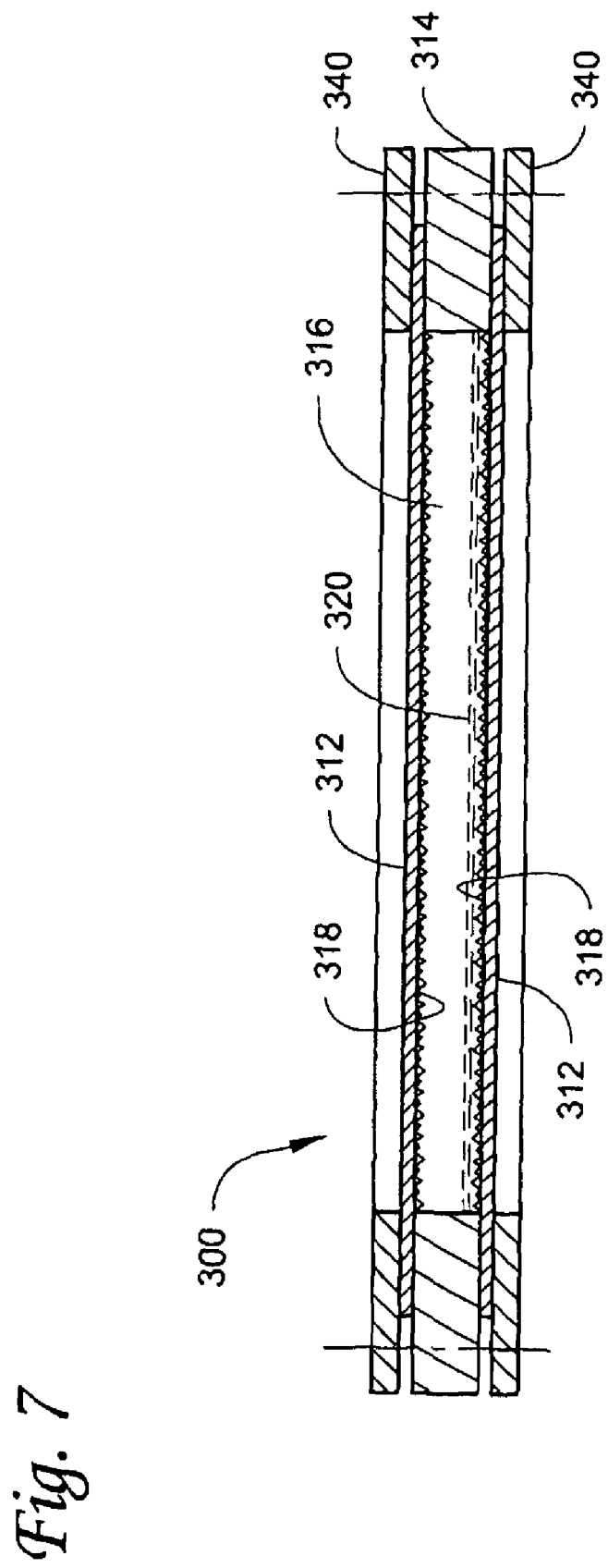

HEAT TRANSFER DEVICE WITH FLEXIBLE COOLING LAYER

FIELD

This disclosure relates to heat transfer devices and more particularly to an innovative flexible cooling layer for use in heat pipe technology for example.

BACKGROUND

Heat pipes are well known devices in the art of heat transfer, for example in electronic cooling applications, such as in avionics. A heat pipe is a closed system used to transfer heat in which a working liquid that is vaporizable and condensable is disposed within a sealed and evacuated enclosure. The liquid is cycled through an evaporation and condensation cycle. Heat entering the enclosure via an evaporator surface vaporizes the liquid, and the vapor then moves to a cooler location in the enclosure where the liquid is condensed and returned back to the evaporator surface to continue the cycle. This heat transfer process in a heat pipe is well understood.

Despite the well known nature of heat pipes, continued improvements to heat pipe technology are necessary. For example, some heat pipes in the past have required that significant mass be added to the device/system cooled, as well as careful manufacturing tolerances and sealing techniques due to the need to produce the pressured vapor enclosure or chamber. Although some heat pipes can transfer heat rapidly through the vapor chamber, getting heat to the chamber remains a challenge. In advanced processing applications, such as in avionics, cooling techniques that will move heat energy away from processors remains a need. The ability to cool such devices, for example, is a factor on processing density.

SUMMARY

Improved heat transfer technology is described that can provide a number of improvements in heat transfer performance, including improvements in an enhanced conduction interface. Another improvement is the minimizing of mass requirements for the heat transfer device, resulting in an overall lighter device or, in some cases, at least minimizing its addition of weight to a device/system being cooled by it. The heat transfer device described herein can be used in various applications, for example electronic cooling applications including, but not limited to, avionics applications.

Generally, the heat transfer device described herein can be used as heat pipe, and includes a flexible layer that is the enhanced conduction interface with a heat generating device. The flexible layer is part of a cooling plate that can at least contact and, in some cases, is at least partially conformable to the heat generating device/system that the heat pipe is intended to cool. The flexible layer can bring heat to a heat pipe chamber throughout the surface of interest.

In some cases, the heat pipe can be formed as a large, planar structure that is nearly isothermal. The isothermal structure can be used to even out and remove hot spots from a structure being cooled, for example in an electronic cooling application. Through the flexible layer, the heat pipe can conform to the shape of a heat generating component intended to be cooled.

In one embodiment of a heat transfer device herein, a flexible layer has outer and inner surfaces. A backing layer has an outer surface and an inner surface, where the inner surface faces the inner surface of the flexible layer. A rigid separator portion is disposed between the inner surfaces of the flexible and backing layers, and has inner and outer surfaces. The inner surfaces of the flexible and backing layers and the rigid separator portion define a sealed chamber. An evaporable working liquid is contained within the sealed chamber. The working liquid expands when heated to expand a volume within the sealed chamber, such that the flexible layer extends away from the sealed chamber. The flexible layer, when extended, transfers heat through the sealed chamber to a cooler area of the device to dissipate heat, for example at least one of the backing layer and the rigid separator portion.

In some cases, the backing layer is one of another flexible layer, such as when two sides of a heat source(s) are cooled, or a rigid portion, such as when a single side of a heat source is cooled. Generally, the heat transfer devices herein can transfer heat from a higher temperature area (e.g. evaporation point) to a lower temperature area (e.g. condensation point), through a rise in vapor pressure in the sealed chamber.

In those cases where the backing layer is a rigid portion, the rigid portion can be any one or more of a separate rigid plate, a separate rigid condenser plate, a condenser surface of a superstructure chassis, and a condenser surface of a module.

In some embodiments, the inner surface of the flexible layer(s) includes a capillary structure, such as a nanostructure array disposed on the inner surface of the flexible layer(s).

In other embodiments, one or more heat transfer devices are housed inside an overall superstructure or chassis, which also houses one or more electronic components generating heat. The one or more heat transfer devices as described herein can be an integral part of the chassis, an integral part of any of the modules present, and/or separate, distinct component(s) disposed proximate the module(s) intended to be cooled.

The designs herein not only can provide a rapid heat transfer device, but also can provide a device that can be easily manufactured (e.g. at low cost), that is low mass, that will not interfere with current systems (e.g. will be passive), and that can be versatile in its assembly, reassembly, or adjustment.

DRAWINGS

FIG. 5 is a side view of the heat transfer device with flexible cooling layer of FIG. 3 shown in an expanded state.

FIG. 6 is a plan view of a PC card rack with showing an embodiment of installing PC cards and the heat transfer device with flexible cooling layer of FIG. 3.

FIG. 7 is a side sectional view of yet another embodiment of a heat transfer device with flexible cooling layer with optional nanostructure array.

DETAILED DESCRIPTION

Figure 1:
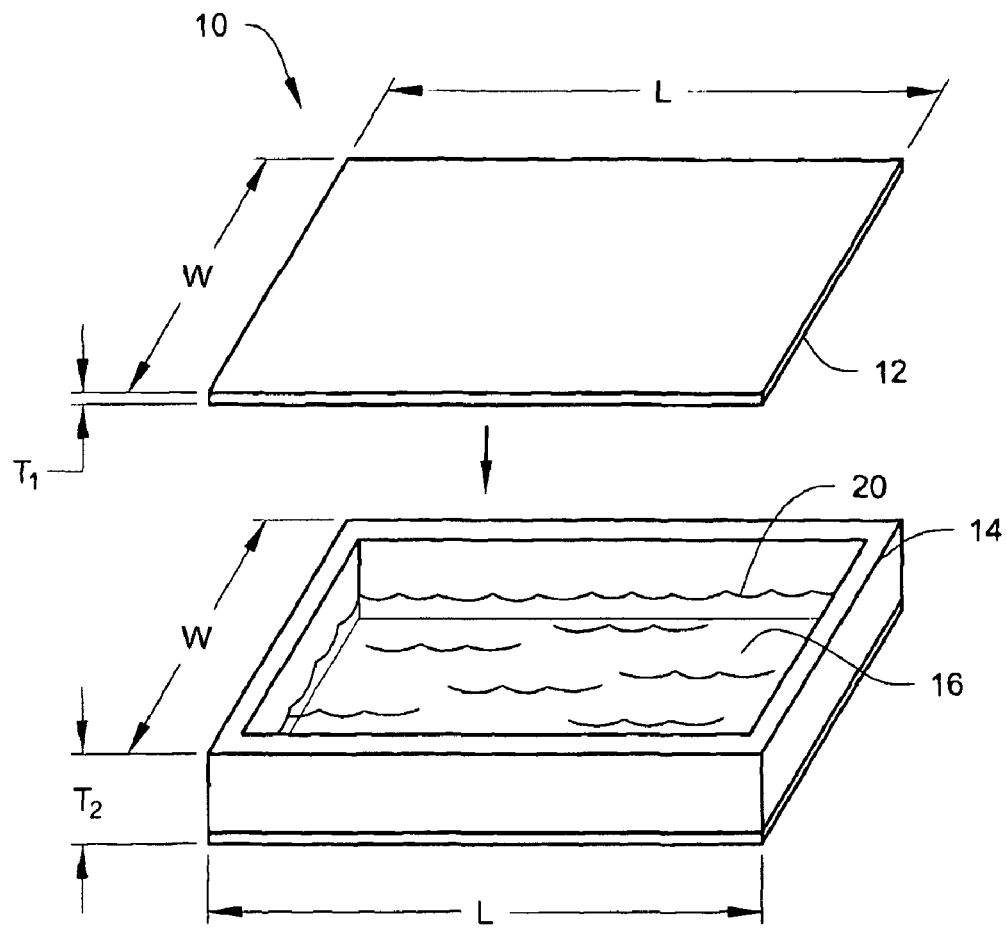
FIG. 1 is a perspective exploded view of an embodiment of a heat transfer device with flexible cooling layer.
Figure 2:
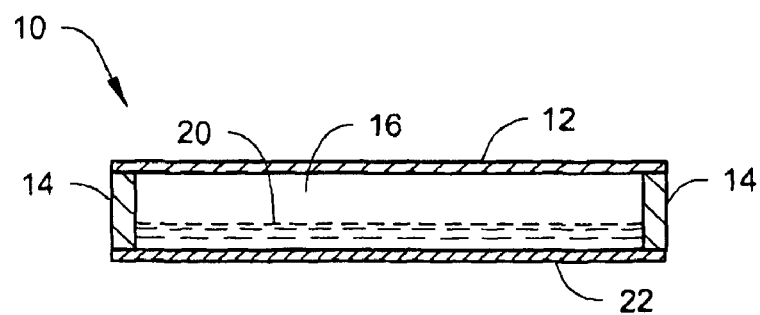
FIG. 2 is side sectional view of the heat transfer device with flexible cooling layer of FIG. 1 in its assembled state.

With reference to FIGS. 1 and 2, an embodiment of an innovative heat transfer device is illustrated and used for example as a heat pipe 10. As shown, the heat pipe 10 is a generally planar structure having a relatively large aspect ratio, i.e. the length L and width W dimensions are significantly greater than its overall thickness ($T_1+T_2$) dimension. It will be appreciated that the length, width, and thickness dimensions can be modified as appropriate depending on for example, the surface area of a heat generating component to be cooled by the heat pipe 10.

As shown, the heat pipe 10 includes a flexible layer 12 with an outer surface and an inner surface, and a backing layer 22 with an outer surface and an inner surface facing the inner surface of the flexible layer 12. A rigid separator portion 14 is disposed between the inner surface of the flexible layer 12 and inner surface of the backing layer 22. The rigid separator portion 14 has an inner surface and an outer surface.

Generally, the heat pipe 10 is a plate-like structure with a sealed space therein, defined by the inner surfaces of the flexible layer 12, backing layer 22, and rigid separator portion 14. The flexible layer 12 and backing layer 22 are generally parallel to each other, and are connected together through the rigid separator portion 14 to define a sealed chamber 16. That is, the sealed chamber 16 is defined within the inner surfaces of the flexible layer 12, the backing layer 22, and the rigid separator portion 14. In one preferred embodiment, the sealed chamber 16 is hermetically sealed.

The flexible layer 12 can be made from any material suitable for forming a heat pipe and that can be sealed to a surface, for example to surfaces of the rigid separator portion 14. It will be appreciated that the flexible layer 12 is heat conductive, where at least portions of its inner surface function as an evaporator surface (further described below) and the outer surface can conform to a surface or surfaces of heat generating components (or heat sink depending on the direction of heat transfer) that are to transfer heat to the heat pipe 10. As some non-limiting examples, the flexible layer is at least one of a metal foil, polyfilm such as polyamid, or a combination thereof. In some cases the relatively large aspect ratio of the heat pipe 10 also can help give the flexible layer its desired flexibility.

Depending on whether cooling of a heat source(s) is desired for one or two sides of the heat source(s), the backing layer 22 is one of another flexible layer, such as for cooling of a heat source(s) with two sides, or a rigid portion, such as for cooling of a heat source with one side. When the backing layer 22 is another flexible layer, the same structure and materials as discussed with respect to the flexible layer 12 are applicable, and the backing layer 22 is sealed to the rigid separator portion 14. As shown, the heat pipe 10 can then be used to cool a heat source(s) with two sides, where each of the flexible layer 12 and backing layer 22 (e.g. another flexible layer) can be used to cool a side of a heat generating component(s).

When the backing layer 22 is a rigid portion, the rigid portion can be a separate rigid condenser plate. As some non-limiting examples, the backing layer 22 as a rigid portion can be made from any material suitable for forming a heat pipe. The backing layer 22 can be rigid, such as when there is no need to conform this portion of the heat pipe to a heat source surface, or when there is a desire to maintain the physical shape of this side when the vapor pressure rises. Under appropriate conditions, the backing layer 22 can also function as a condensing surface (further described below) and a heat dissipating surface, for example, when the temperature is low enough relative to evaporating surfaces on portions of the flexible layer 12 or other areas in the chamber.

In other embodiments, the backing layer 22 can be a condenser and heat dissipating surface of a superstructure chassis and/or a condenser surface of a module. In such configurations, the heat pipe 10 may be integrally attached to a larger structure or equipment, for example to the actual heat generating component (e.g. module(s)) or another hotspot in need of cooling (e.g. chassis).

It will be appreciated that the flexible layer 12 and the backing layer 22 need not be made of the same material. In some embodiments, the flexible layer 12 can be made of the same material as the heat generating component, which the heat pipe 10 is to cool, while the backing layer 22 is made of a different material. It also will be appreciated that one or more of the flexible layer 12 and backing layer 22 can also match the thermal expansion coefficient of the heat generating component being cooled. In some embodiments, the heat pipe overall can be observable, such as when one or more of its components are made of transparent materials.

With further reference to FIGS. 1 and 2, an evaporable working liquid 20 is contained within the sealed chamber 16. The working liquid 20 is expandable when exposed to heat, such that the flexible layer 12 can flex and extend away from the sealed chamber 16. The evaporable working fluid can be any liquid suitable for a heat pipe, i.e. one that is in a liquid state and that is readily evaporable and then condensable back into its liquid state. As some non-limiting examples, the working fluid 20 can be water, toluene, or a mixture thereof. As shown, the evaporable working fluid 20 is disposed inside the sealed chamber 16. It will be appreciated that the working liquid(s) selected will be based on, for example, the operating temperatures which the heat pipe 10 will be expected to experience.

Generally in a heat transfer operation, the flexible layer 12, when exposed to heat, extends from the sealed chamber 16 and is configured to at least contact and at least partially conform to a heat generating component (or heat sink depending on the direction of heat transfer), so as to receive and transfer heat from the heat generating component to at least one of the backing layer 22 and the rigid separator portion 14.

The flexible layer 12 extends from the sealed chamber 16 when the working fluid evaporates and expands. Evaporation of the evaporable working fluid 20 may occur at any number of arbitrary locations along the inner surface of the flexible layer 12, and likewise, condensation may occur over various portions of inner surface of the backing layer 22 and rigid separator portion 14, and/or over portions of the inner surface of the flexible layer 12 which are not utilized as evaporation sites. That is, portions of the inner surface of the flexible layer 12 may also act as condensation areas, depending on relative temperature of the components. When the heat pipe 10 is connected to or positioned proximate a heat generating component, heat from the heat generating component flows into the heat pipe 10 via the flexible layer 12. The heat causes the working fluid 20 to evaporate into vapor. The vapor flows toward cooler portions (e.g. backing layer 22, rigid separator portion 12, or portions of flexible layer 12), which exchanges heat with the vapor, cooling the vapor so that it condenses back into a liquid state. The heat is then dissipated from the heat pipe, for example through rigid separator portion 14, the backing layer 22 (when used as condenser) and parts of the flexible layer 12 that may not being used to evaporate the working fluid 20. Generally, the direction of heat transfer is limited only by relative temperature and it will be appreciated that heat transfer and dissipation will occur from higher temperatures to lower temperatures, as long as proper vaporization temperatures are achieved.

By making the heat pipe 10 flexible, the heat pipe can more readily conform to the shape of the heat generating component (or heat sink depending on the direction of heat transfer) to which it is attached, thereby achieving increased intimate contact between the heat pipe 10 and the heat generating component. In addition, the increase in internal pressure of the heat pipe 10 during operation (i.e. evaporation of the working fluid 20) helps cause the flexible layer 12 to expand and press against the heat generating component, further increasing the intimate contact.

In the example of heat transfer from a heat generating component, the heat generating component can be an electronic module such as a printed circuit board, which may include one or more electronic devices such as, but not limited to, a processor, memory, a storage device, and an input/output element. In some cases, such heat generating components are for use in various applications including, but not limited to, avionics.

The heat pipes herein can also employ a glass fabric as a transport material or employ other materials, such as capillary structures (further discussed below) to aid as fluid channeling structures and cycle the working fluid 20. Such materials are often located on inner surfaces or walls within the sealed chamber 16, for example on one or more surfaces of the flexible and backing layers 12, 22. When a given heat source is applied to the heat pipe 10, the area of heat transfer allows some vaporization to occur at least at the specific point inside the chamber (provided a selected working fluid 20 has an appropriate vaporization point) and the pressure begins to increase as vapor is produced. This in turn raises the condensation point and increases the vaporization point until the system reaches an equilibrium point, where the vapor is no longer being produced at the heat source point of contact. Condensation can then begin to occur at the coolest region. Thus, the working fluid 20 is transported through the heat pipe by means of vapor, and then after condensation can be replenished at the point of vaporization in a liquid form. Fluid channeling structures, such as a glass fabric or capillary provide a transport media, to allow the working fluid 20 to cycle through the heat pipe 10. As described, such structures are along an interior wall(s) within the chamber and have a contiguous flow path to allow the working fluid to return to an area of evaporation and complete cycle.

Figure 3:
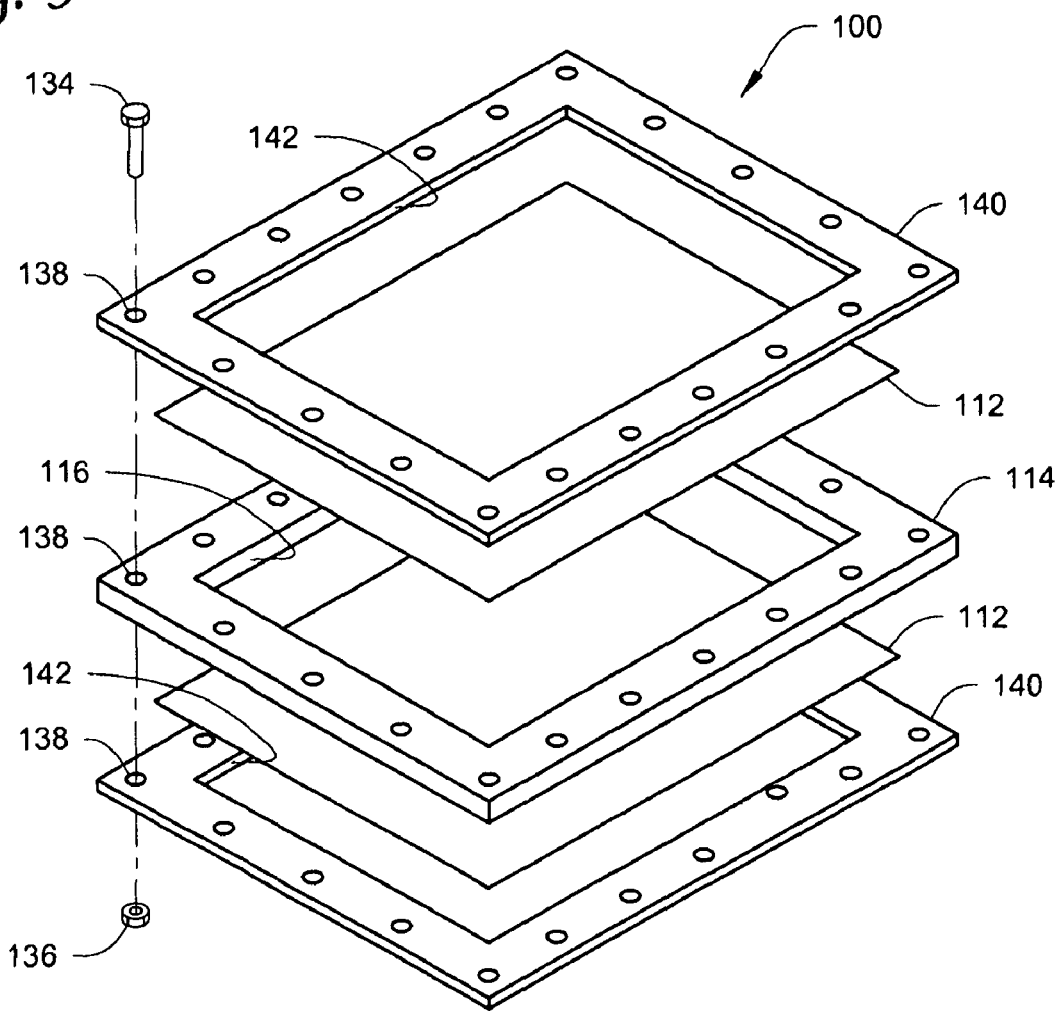
FIG. 3 is a perspective exploded view of another embodiment of a heat transfer device with flexible cooling layer.
Figure 4:
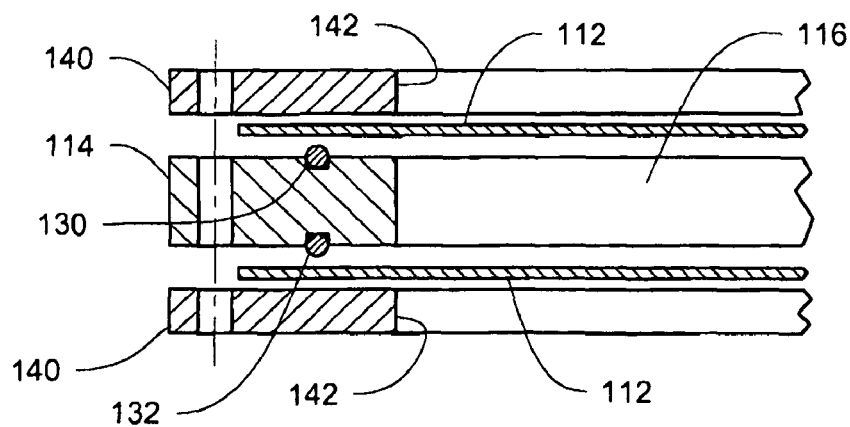
FIG. 4 is a side sectional view of the heat transfer device with flexible cooling layer of FIG. 3 in its assembled state.

FIGS. 3-5 show another embodiment of a heat pipe 100 with flexible layer 112. In some cases, for example, when a heat pipe is to be separate, distinct component, various support, seal, and clamping structures may be employed to assemble the flexible layer and properly seal the chamber.

As shown in FIGS. 3 and 4, the heat pipe 100 generally includes a clamping plate 140 disposed over the flexible layer 112 and the flexible layer 112 is sealed to a rigid separator 114. The rigid separator 114 is generally structured as a frame with an outer and inner edge that defines a window. The thickness of the rigid separator 114 defines at least part of the chamber 116 (see e.g. FIG. 4). The clamping plate 140 also is generally structured as a frame with an outer edge and an inner edge. A window 142 is defined by the inner edge, so that the flexible layer 112 can extend through the window upon exposure to heat. That is, the window of the clamping plate 140 is configured to allow an evaporable working fluid (not shown) to expand in the sealed chamber 116 when exposed to heat to thereby allow the flexible layer 112 to extend from the sealed chamber 116. FIG. 5 shows a side view of the heat pipe 100 with the flexible layer 112 in the extended state.

With further reference to FIGS. 3 and 4, the clamping plate 140 can be secured to the rigid separator 114, such as by fasteners 134, 136 inserted through holes 138. As one example, the fasteners 134, 136 are a nut and bolt inserted through holes 138 of the clamping plate 140 and rigid separator.

Regarding the seal, the flexible layer 112 in the example shown is sealed to the rigid separator 114 through a groove 130 and gasket seal 132. The groove 130 is disposed in the frame of the rigid separator 114. When the clamping plate 140 is secured to the rigid separator 114, the gasket seal 132 can be compressed to seal the flexible layer 112 to the rigid separator 114. As shown, the flexible layer 112 has a dimension larger than the windows of the clamping plate 140 and rigid separator 114, and is pressed between the clamping plate 140 and the rigid separator 114. It will be appreciated that the seal can be achieved in a variety of ways that do not require a clamping plate, a nut/bolt fastener, or gasket. In other cases, the flexible layer 112 can be sealed to the rigid separator 114, such as by thermal compression bond, a welded seam seal.

In the embodiment shown, the heat pipe 100 is a cooling device that can cool a heat source(s) with two sides using two flexible layers 112, two clamping plates 140, and two gasket grooves/seals 130, 132. It will be appreciated, that the structure shown can be modified for cooling of a heat source with one side, where one of the flexible layers 112 and clamping plates 140 is replaced by a rigid backing layer, or one side of the rigid separator 114 is sealed off.

As described above, a heat pipe herein can be housed inside an overall superstructure or chassis, which also houses one or more modules or electronic components generating heat. One or more heat pipes as described herein can be distinct component(s) housed by a chassis, and disposed proximate the module(s) intended to be cooled.

Exemplary Application for Improved Heat Pipe—PC Card Rack

Producing a high performance processing card, such as for avionics applications, can often result in significant thermal challenges. Past solutions have employed liquid or conduction cooling that enables heat to flow away from critical components (e.g. expensive and heavy spray-cooling systems or graphite impregnated boards). Such past approaches often require specific designs for a given application, which can be costly and time-consuming, and often require adding significant weight to systems that already are weight sensitive.

Using principles flexible layer of a heat pipe described herein, for example, the above problems among others, can be addressed. The heat pipe can be placed into, for example, an existing card rack enclosure and in between high thermal energy components. In some cases, the heat pipe is passive, and will remain out of contact with the components until ambient temperature within the enclosure begins to increase. As the temperature rises, the flexible layer begins to extend from the sealed chamber to the increase of liquid vapor within the heat pipe. This will cause the flexible layer to billow outward (see e.g. FIG. 5), and eventually make contact with the heat generating cards (e.g. PCB cards) surrounding the heat pipe.

A conductive path is created to allow direct heat flow, for example, to the card cage (e.g. chassis enclosure), effectively increasing heat flow capabilities. Such a configuration allows for a stepped solution, using a heat pipe herein for example as a retrofit component, so that typical design flow paths are utilized in small thermal gradients. When large thermal demands are provided, the heat pipe passively intersects the flow path and channels heat away from the source (e.g. heat generating component or other hot surface) at an increased rate. When under relatively cool conditions, the flexible layer 'shrinks' or loses extension and contact with the heat generating component (e.g. PCB cards). In some cases, such a configuration can be used as at appropriate areas where thermal transfer problems exist, and that is easy to assemble/reassemble, retrofit, install, maintain.

FIG. 6 shows one embodiment of such a system, where a chassis 160 is a PC card rack showing how to install PC cards 150 and a heat pipe. For ease of description, the heat pipe 100 is shown, but it will be appreciated that any of the heat pipes described herein can be implemented in this system concept, for example, for cooling of a heat source with one side, heat pipes integrally connected to any of the modules (e.g. PC cards 150) and/or integrally connected with the chassis 160. As shown, the chassis 160 includes a generally open area 162 that can house the PC cards 150 and the heat pipe(s) 100. A cover 166 covers the open area 162 to form an enclosure for the chassis 160. In the arrangement as shown, the heat pipe 100 is disposed proximate the PC cards 150, for example interspersed between PC cards 150.

As one example, a plurality of PC cards 150 are housed in the chassis 160, with a plurality of the heat pipes 100 interposed between the PC cards 150.

In some embodiments, the chassis 160 has guides 164 configured to allow the PC cards 150 to slide into the chassis 160. The guides 164 are configured to hold the PC cards 150 in place. Where a heat pipe is its own separate, distinct component such as heat pipe 100 (e.g. not integral with a module or chassis), similar guides 164 may be constructed to allow the heat pipe 100 to slide into the chassis proximate/between the PC cards 150. Such a configuration can provide a shelf-like cooling arrangement.

Incorporation of Wicking Structures

When producing a heat pipe herein, some embodiments will employ a wicking material within the sealed vapor chamber. This material allows the rapid movement of liquid within the chamber due to capillary action. As one skilled in the art will appreciate, inside a heat pipe at a hot interface, such as on the evaporator surface, the working fluid turns to vapor and the gas naturally flows and condenses on a cold interface. The liquid falls or is moved by capillary action back to the hot interface to evaporate again and repeat the cycle.

Using wicking structures facilitate capillary action can enhance the heat pipe capability, such as when the heat pipe is in an environment with high accelerations. Using wicking structures also helps to maintain a liquid source for the area being cooled, which is where vaporization occurs. Starvation of liquid from this locale can sometimes reduce the effectiveness of a heat pipe device and even cause failure of the heat pipe device. When a heat pipe is used, for example in high-G environments, the function of capillary pumping can be particularly helpful and is often needed. This is due to the fact that capillary action can transport or 'pump' fluids against the flow of gravity, thereby avoiding the need to rely on the heat source as the area where gravity would cause the liquid to pool there. The capillary action overcomes this limitation and therefore makes it useful for avionics as an example. However, when a flexible layer as described herein is utilized, it is beneficial to avoid restrictions in the flexible film when a wicking structure are used, and also avoid damage to the wicking structure, both of which may degrade performance of the heat pipe.

FIG. 7 shows yet another embodiment of a heat pipe 300 with a flexible layer 312 and incorporating a wicking structure that addresses the above issues, among others. In the embodiment shown, the heat pipe 300 can be arranged similarly as heat pipe 100 in that it can have one or more clamping plates 340 over a rigid separator 314, a sealed chamber 316, and one or more flexible layers 312. Differently from the above embodiments, the heat pipe 300 includes a wicking structure that is a nanostructure array 318 on inner surfaces of the flexible layer(s) 312. The nanostructure array 318 is a nanoporous wicking material such as, but not limited to, carbon nanotubes. As shown, the nanostructure array 318 forms hair-like nanoporous wicks to provide the capillary action of the fluid 320. It will be appreciated that any of the heat pipes described herein may incorporate the nanostructure array 318 on a flexible layer 312.

The design of the nanostructure array 318 on the flexible layer(s) 312 can take advantage of carbon nano-tube (CNT) growing technology on the surface of the flexible layer(s) 312. Due to the small-scale of the CNT structures, the flexible movement of the flexible layer is not restricted and the nanostructure is not significantly limited. This is because the bend radius of the flexible layer greatly exceeds the height of typical nano-structures, such that the CNT structures would not be damaged and do not cause the flexible layer or membrane to act significantly different physically, as the movement of the flexible layer is at the macro level versus movement of the CNT structures at the micro level or lower. Such a structure can maintain the operational capability of the heat pipe while in the flexure state.

In one embodiment, the nanostructure array 318 can be a very thin layer of CNT structure, which looks like small hair-like structures on the surface of the flexible layer(s) 312. As one example, the each hair-like structure can be about 50 nm in diameter and have a height at about 60 to 100× the diameter. Since the bend radius of the flexible layer(s) 312 is much larger than the nano-scaled components, the CNT structures can move freely with the flexible layer(s) 312, and can help maintain capillary flow of working fluid 320. As described, the nanostructure can provide a sustainable surface and capillary flow paths even when flexure occurs in the flexible layer(s) 312 of the heat pipe 300.

The above inventive principles can provide a heat pipe with many benefits. Among such benefits, the designs herein can provide a rapid heat transfer device, and also provide a device that can be easily manufactured (e.g. at low cost), that is low mass, that will not interfere with current systems (e.g. will be passive), and that can be versatile in its assembly, reassembly, or adjustment.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A heat transfer device, having extended and non-extended states, comprising:
   a flexible layer with an outer surface and an inner surface;
   a backing layer with an outer surface and an inner surface facing the inner surface of the flexible layer;
   a rigid separator portion disposed between the inner surface of the flexible layer and inner surface of the backing layer, the rigid separator portion having an inner surface and an outer surface;
   a sealed chamber defined within the inner surfaces of the flexible layer, the backing layer, and the rigid separator portion;
   an evaporable working liquid contained within the sealed chamber, the working liquid being expandable when exposed to heat to expand a volume of the sealed chamber, the flexible layer having a non-extended state, the flexible layer having an extended state when the working liquid is exposed to heat to expand the volume of the sealed chamber, at least a portion of the flexible layer configured to receive heat and to transfer received heat within the sealed chamber to an area cooler than the portion of the flexible layer that receives heat; and
   a clamping plate disposed over the flexible layer, the clamping plate secured to the rigid separator portion with an edge of the flexible layer therebetween, the clamping plate having an inner surface facing the flexible layer, an outer surface facing away from the flexible layer, and a thickness between the inner and outer surfaces including an inner edge that defines a window over the flexible layer in the non-extended state, such that the flexible layer in the non-extended state is located entirely between the outer surface of the clamping plate and the sealed chamber, the window is configured to allow the flexible layer to extend through the window into the extended state when the working liquid is exposed to heat to expand the volume of the sealed chamber.

2. The heat transfer device of claim 1, wherein the flexible layer is at least one of a metal foil, polyfilm, or a combination thereof.

3. The heat transfer device of claim 1, wherein the flexible layer, when extended from the sealed chamber, is configured to conform at least partially to a heat generating component or a heat sink depending on a direction of heat transfer within the device, so as to receive and transfer heat from the heat generating component or heat sink to at least one of the backing layer and the rigid separator portion.

4. The heat transfer device of claim 1, wherein the backing layer is one of another flexible layer or a rigid portion.

5. The heat transfer device of claim 4, wherein, when the backing layer is a rigid portion, the rigid portion comprising one of a separate rigid plate, separate rigid condenser plate, a condenser surface of a superstructure chassis, a condenser surface of a module.

6. The heat transfer device of claim 1, wherein the sealed chamber is a hermetically sealed chamber.

7. The heat transfer device of claim 1, wherein the evaporable working liquid comprises at least one of water, toluene, and mixtures thereof.

8. The heat transfer device of claim 1, wherein the backing layer is a second flexible layer, the second flexible layer having a non-extended state, the second flexible layer having an extended state when the working liquid is exposed to heat to expand the volume of the sealed chamber, at least a portion of the second flexible layer
configured to receive heat and to transfer received heat within the sealed chamber to an area cooler than the portion of the second flexible layer that receives heat, and further comprising
a second clamping plate disposed over the second flexible layer, the second clamping plate secured to the rigid separator portion with an edge of the second flexible layer therebetween, the second clamping plate having an inner surface facing the second flexible layer, an outer surface facing away from the second flexible layer, and a thickness between the inner and outer surfaces including an inner edge that defines a second window over the second flexible layer in the non-extended state, such that the second flexible layer in the non-extended state is located entirely between the outer surface of the second clamping plate and the sealed chamber, the second window is configured to allow the second flexible layer to extend through the second window into the extended state when the working liquid is exposed to heat to expand the volume of the sealed chamber.

9. The heat transfer device of claim 1, further comprising a capillary structure disposed on the inner surface of the flexible layer.

10. The heat transfer device of claim 9, wherein the capillary structure is a nanostructure array disposed on the inner surface of the flexible layer.

11. The heat transfer device of claim 10, wherein the nanostructure array comprises a nanoporous wicking material, the nanoporous wicking material comprising carbon nanotubes.

12. A system, having extended and non-extended states, comprising: at least one module;
a housing to receive of the module and to enclose the module; and
at least one heat transfer device disposed proximate the module and inside the housing, the heat transfer device comprising:
a flexible layer with an outer surface and an inner surface;
a backing layer with an outer surface and an inner surface facing the inner surface of the flexible layer;
a rigid separator portion disposed between the inner surface of the flexible layer and inner surface of the backing layer, the rigid separator portion having an inner surface and an outer surface;
a sealed chamber defined within the inner surfaces of the flexible layer, the backing layer, and the rigid separator portion;
a fluid contained within the sealed chamber, the fluid being expandable when exposed to heat to expand a volume within the sealed chamber, the flexible layer having a non-extended state, and the flexible layer having an extended state when the working liquid is exposed to heat to expand the volume of the sealed chamber, at least a portion of the flexible layer configured to receive heat and to transfer received heat within the sealed chamber to an area cooler than the portion of the flexible layer that receives heat; and
a clamping plate disposed over the flexible layer, the clamping plate secured to the rigid separator portion with an edge of the flexible layer therebetween, the clamping plate having an inner surface facing the flexible layer, an outer surface facing away from the flexible layer, and a thickness between the inner and outer surfaces including an inner edge that defines a window over the flexible layer in the non-extended state, such that the flexible layer in the non-extended state is located entirely between the outer surface of the clamping plate and the sealed chamber, the window is configured to allow the flexible layer to extend through the window into the extended state when the working liquid is exposed to heat to expand the volume of the sealed chamber.

13. The system of claim 12, wherein the module is a printed circuit board.

14. The system of claim 12, wherein the housing is a card rack comprising guides configured to allow the module to slide into the housing and configured to hold the module in place, and further comprising guides configured to allow the heat transfer device to slide into the housing proximate module.

15. The system of claim 12, wherein the backing layer is one of a separate rigid plate, separate rigid condenser plate, a condenser surface of the housing, or a condenser surface of the module.

16. The system of claim 12, further comprising a plurality of the modules and a plurality of the heat transfer devices interposed between the modules.

17. The system of claim 16, wherein each of the modules is a printed circuit board comprising at least one electronic device, the electronic device comprising a processor, memory, a storage device, and an input/output element.

18. The system of claim 12, wherein the module is an aviation electronics module.

19. The heat transfer device of claim 1, wherein the rigid separator includes a groove and a gasket disposed in the groove, the clamping plate is secured to the rigid separator to compress the gasket seal, so as to seal the flexible layer to the rigid separator and press the flexible layer between the clamping plate and the rigid separator.

* * * * *